United States Patent
Wakabayashi et al.

(10) Patent No.: US 9,222,430 B2
(45) Date of Patent: Dec. 29, 2015

(54) MULTICORE PROCESSOR AND ONBOARD ELECTRONIC CONTROL UNIT USING SAME

(75) Inventors: Tetsuaki Wakabayashi, Toyota (JP); Soichiro Arai, Okazaki (JP)

(73) Assignees: TOYOTA JIDOSHA KABUSHIKI KAISHA, Toyota-shi (JP); DENSO CORPORATION, Kariya (JP)

(*) Notice: Subject to any disclaimer, the term of this patent is extended or adjusted under 35 U.S.C. 154(b) by 1031 days.

(21) Appl. No.: 12/983,487

(22) Filed: Jan. 3, 2011

(65) Prior Publication Data

US 2011/0191620 A1   Aug. 4, 2011

(30) Foreign Application Priority Data

Feb. 1, 2010   (JP) ................ 2010-020624

(51) Int. Cl.
G06F 1/32 (2006.01)
H03L 7/16 (2006.01)
F02D 41/26 (2006.01)
G06F 1/06 (2006.01)

(52) U.S. Cl.
CPC ........ F02D 41/26 (2013.01); G06F 1/06 (2013.01); G06F 1/3203 (2013.01); H03L 7/16 (2013.01); Y02B 60/1217 (2013.01)

(58) Field of Classification Search
USPC ................................................. 713/322, 500
See application file for complete search history.

(56) References Cited

U.S. PATENT DOCUMENTS

| | | | | |
|---|---|---|---|---|
| 2002/0157032 A1* | 10/2002 | Jensen et al. | ........... | 713/500 |
| 2003/0042962 A1* | 3/2003 | Bonaccio et al. | ........... | 327/295 |
| 2004/0068673 A1* | 4/2004 | Espinoza-Ibarra et al. | ... | 713/501 |
| 2006/0282692 A1* | 12/2006 | Oh | ........... | 713/300 |
| 2007/0283128 A1* | 12/2007 | Hoshaku | ........... | 712/1 |
| 2008/0141062 A1* | 6/2008 | Yamaoka | ........... | 713/501 |
| 2009/0138737 A1* | 5/2009 | Kim et al. | ........... | 713/322 |
| 2009/0138748 A1* | 5/2009 | Kim et al. | ........... | 713/503 |
| 2009/0265498 A1* | 10/2009 | Yamaoka | ........... | 710/305 |
| 2011/0119475 A1* | 5/2011 | Chen et al. | ........... | 713/2 |

FOREIGN PATENT DOCUMENTS

| | | |
|---|---|---|
| JP | 8-54955 | 2/1996 |
| JP | 2004-22724 | 1/2004 |
| JP | 2007-43554 | 2/2007 |
| JP | 2007-47966 | 2/2007 |
| JP | 2008-97280 | 4/2008 |
| JP | 2011-35611 A | 2/2011 |
| JP | 2011-60091 A | 3/2011 |

* cited by examiner

*Primary Examiner* — Kim Huynh
*Assistant Examiner* — Brandon Kinsey
(74) *Attorney, Agent, or Firm* — Oblon, McClelland, Maier & Neustadt, L.L.P.

(57) ABSTRACT

A multicore processor according to the invention has a plurality of cores. The plurality of cores are configured to operate at an operation clock with a frequency varying periodically with the same period, and a variation phase of a frequency of the operation clock of each core of the plurality of cores is shifted by a predetermined amount among the plurality of cores.

12 Claims, 9 Drawing Sheets

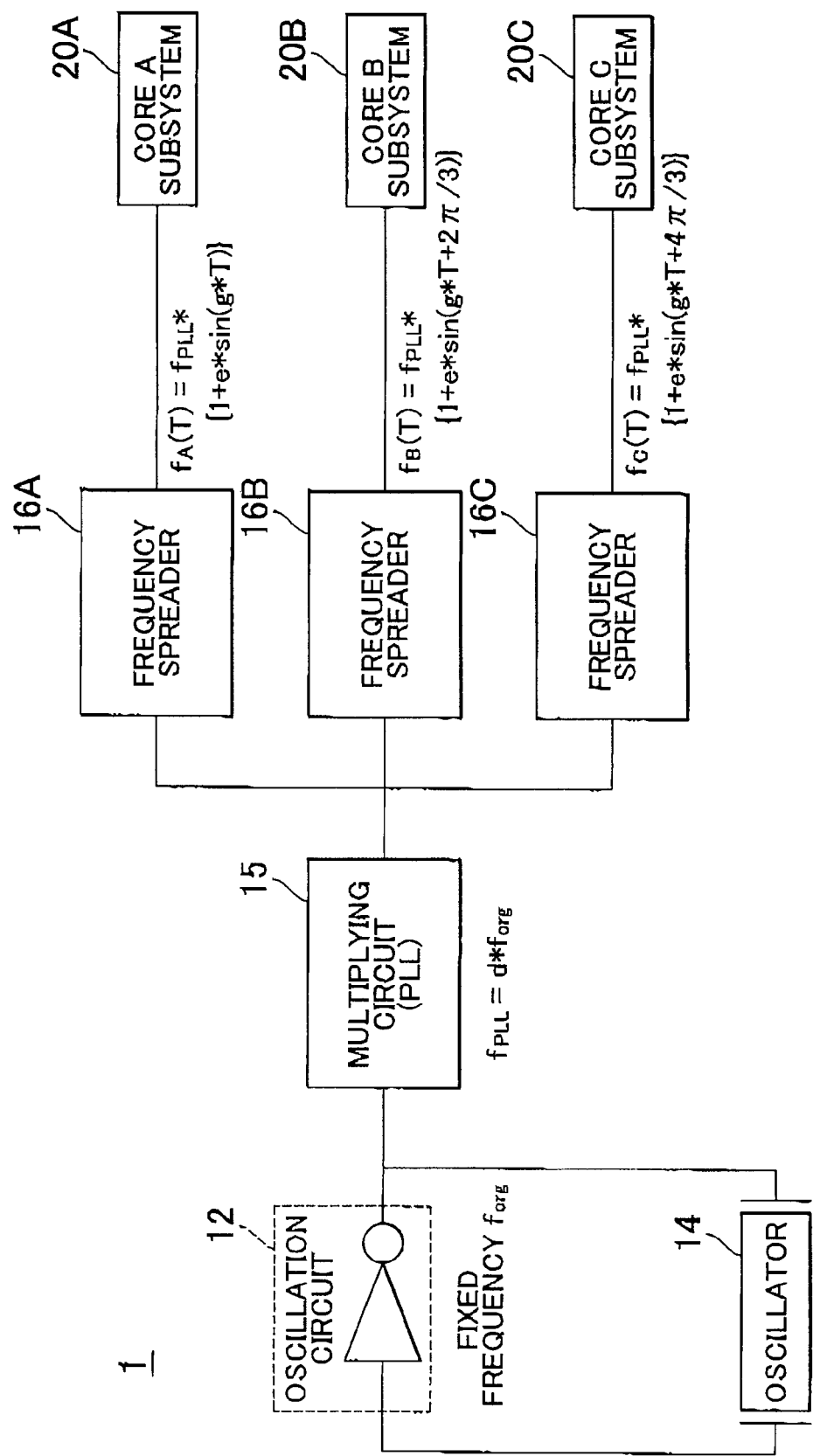

MULTICORE PROCESSOR AND ONBOARD ELECTRONIC CONTROL UNIT USING SAME

INCORPORATION BY REFERENCE

The disclosure of Japanese Patent Application No. 2010-020624 filed on Feb. 1, 2010 including the specification, drawings and abstract is incorporated herein by reference in its entirety.

BACKGROUND OF THE INVENTION

1. Field of the Invention

The invention relates to a multicore processor carrying a plurality of cores and an onboard electronic control unit using same.

2. Description of the Related Art

For example, Japanese Patent Application Publication No. 2007-47966 (JP-A-2007-47966) describes reducing power consumption in a low power consumption mode of an electronic device that will make a transition to a stand-by mode, the electronic device using a large scale integration (LSI) incorporating a plurality of central processing unit (CPU) cores. In such an electronic device, a CPU is provided with a usual operation mode and a low power consumption mode, a clock frequency supplied to the CPU can be changed, the CPUs can detect the operation mode of each other, and the CPUs can notify each other of an operation mode change request.

For example, Japanese Patent Application Publication No. 2007-43554 (JP-A-2007-43554) describes an electromagnetic interference (EMI) countermeasure method in an electronic circuit substrate having an application-specific integrated circuits (ASIC) (integrated circuit) mounted thereon, wherein ripples are superimposed on a power source voltage supplied to power source terminals of the ASIC, whereby the stability of operating frequency of a logic circuit frequency and a power source line inside the ASIC is decreased and a jitter component of the operating frequency of the internal circuit of the ASIC is increased, thereby reducing EMI (radiation noise) from the ASIC and electronic circuit substrate.

An onboard electronic system is constituted by a plurality of electronic control units (ECU), and practically all of the ECU carry a microcomputer (a computational device in which the processing contents can be easily changed by software). A microcomputer incorporates a core (also called a CPU) processing the software. In recent years, the clock frequency that causes the core to operate has greatly increased due to a demand for rapid increase of processing capacity and became a main factor of radiation noise generated by the ECU. In particular, in a multicore processor that carries a plurality of cores, since a large number of cores operating at a high frequency are present, high-intensity noise is generated at a frequency that is obtained by dividing or multiplying the operating frequency.

Concerning the radiation noise, in FIG. 1, a frequency is plotted against the abscissa and a noise signal intensity is plotted against the ordinate for two signals S1, S2. As shown in FIG. 1, the signal S1 has an average level of signal intensity lower than that of the signal S2, but the peak signal is equal to or higher than a determination threshold at the natural frequency. In this case, the signal S2 produces a smaller effect on the acoustic system because no peak signal is present.

Concerning power consumption, FIG. 2 shows an example of variation of power consumed by a microcomputer with time. When power variation such as shown in FIG. 2 is present, the power source IC in the electronic control unit should be designed to have power supply capability that satisfies the peak values (generated in software processing of a constant period) in points of time $t_{a1,a2,a3}$. Furthermore, the variation accommodation capability that makes it possible to accommodate such power variations is required and this results in increased cost.

These problems are mainly attributed to the fact that the core operates at a constant frequency, and the effect thereof becomes significant in the case of multiple cores.

Another possible countermeasure involves changing the core operating frequency in a time sequence. However, a problem arising when the operating frequency of each core is changes in a time sequence in a similar manner in the case of multiple cores is that the effect increases proportionally to the number of cores.

SUMMARY OF THE INVENTION

The invention provides a multicore processor that makes it possible to resolve, at least partially, the problem of radiation noise and the like by appropriately changing the operating frequency of each core in a time sequence and an onboard electronic control device using same.

The first aspect of the invention relates to a microprocessor. The microprocessor is provided with a plurality of cores, the plurality of cores are configured to operate at an operation clock with a frequency varying periodically with the same period, and a variation phase of a frequency of the operation clock of each core of the plurality of cores is shifted by a predetermined amount among the plurality of cores.

The second aspect of the invention relates to an onboard electronic control unit. The onboard electronic control unit is provided with a multicore processor having a plurality of cores, wherein the plurality of cores are configured to operate at an operation clock with a frequency varying periodically with the same period, and a variation phase of a frequency of the operation clock of each core of the plurality of cores is shifted by a predetermined amount among the plurality of cores.

In accordance with the invention, a multicore processor is obtained that makes it possible to resolve, at least partially, the problem of radiation noise and the like by appropriately changing the operating frequency of each core in a time sequence.

BRIEF DESCRIPTION OF DRAWINGS

The features, advantages, and technical and industrial significance of this invention will be described in the following detailed description of example embodiments of the invention with reference to the accompanying drawings, in which like numerals denote like elements, and wherein:

FIG. 7 shows an example of internal and external circuit configurations of a microcomputer according to the aforementioned embodiment of the invention;

DETAILED DESCRIPTION OF EMBODIMENTS

The first and second embodiments of the invention will be explained below with reference to the appended drawings.

Figure 3A:
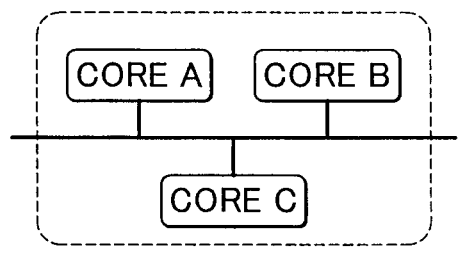
FIG. 3A shows a symmetrical multicore.
Figure 3B:
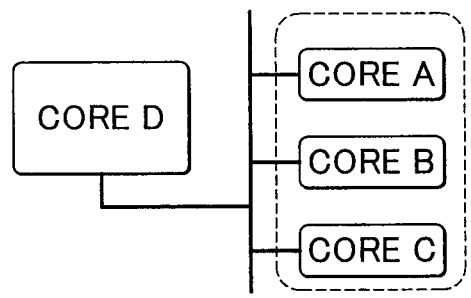
FIG. 3B shows an asymmetrical multicore.

FIG. 3A shows a symmetrical multicore as a type of microcomputer with a multicore configuration (multicore processor). FIG. 3B shows an asymmetrical multicore. In the multicores of these types, it is desirable that three cores (CPU cores) A, B, C have equivalency of core capabilities. The invention can be applied to multicore processors of any type, inclusive of the aforementioned symmetrical type, asymmetrical type, and analogues thereof. The three cores A, B, C such as shown in the figure will be explained below as application objects of the invention. However, the invention can be likewise applied to the two cores or four and more cores.

Figure 4:
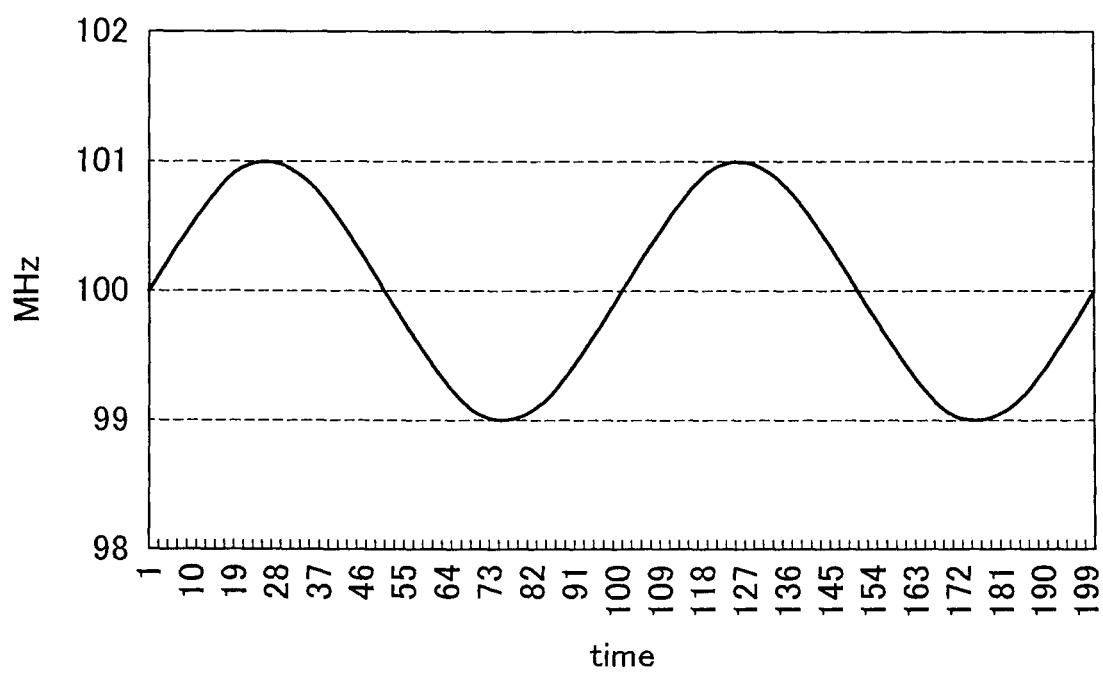
FIG. 4 shows an example of a core operating frequency.

FIG. 4 shows an example of core operating frequency. In the example shown in FIG. 4, the core operating frequency is set, by way of example, to vary sinusoidally within a ±1 MHz range about 100 MHz as a center. The configuration in which the core operating frequency is thus varied in a time sequence makes it possible to reduce the intensity of radiation noise generated at a frequency obtained by division or multiplication of the core operating frequency by comparison with the configuration in which the core operating frequency is fixed at all times.

Figure 5A:
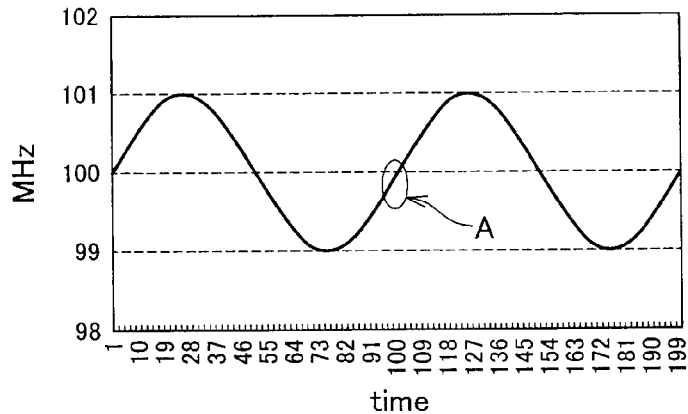
FIGS. 5A to C show waveforms in the case in which the variation mode of the core operating frequency shown in FIG. 4 is applied similarly to all of the three cores.
Figure 5B:
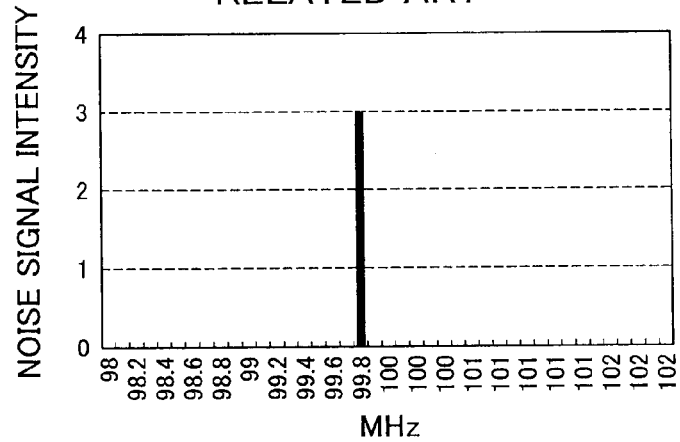
Figure 5C:
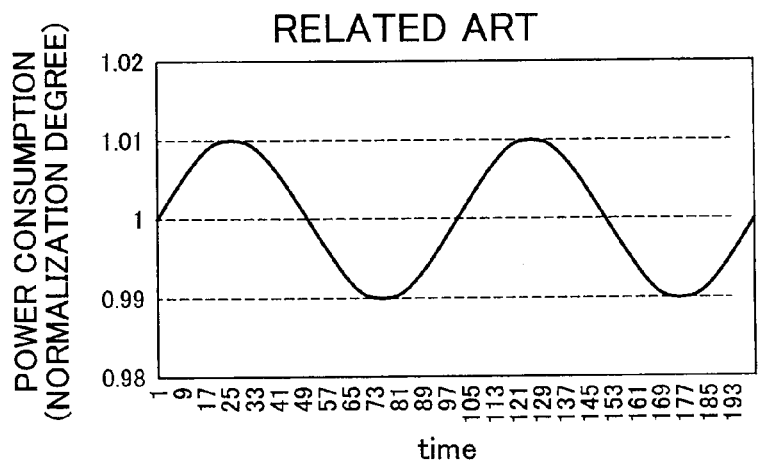

FIGS. 5A to C show waveforms in the case in which the variation mode of the core operating frequency shown in FIG. 4 is applied similarly to all of the cores A, B, C. Thus, FIGS. 5A to C show waveforms in the case in which all of the cores A, B, C operate at a clock frequency varying with the same phase. FIG. 5A shows a waveform (waveforms are identical for the cores A, B, C and are therefore superimposed on each other) of a variation mode of the operating frequency of cores A, B, C. FIG. 5B shows a noise frequency generated by the microcomputer at a certain point in time (in the present example, an A portion in FIG. 5A) and the intensity (relative value) thereof. FIG. 5C shows a time-sequence waveform of power consumption in the time sequence identical to that in FIG. 5A. In FIG. 5C, power consumption is represented by a waveform of normalized power consumption.

As shown in FIG. 5A to C, when the variation modes of the operating frequency of all of the cores A, B, C are identical, the noise signal appears at the same frequency in the three cores A, B, C. Therefore, the noise signal intensity (sum total) is a superposition of intensities of noise (peaks) generated at the same frequency in the three cores A, B, C as shown in FIG. 5B.

Power consumption (sum total) caused by the operation of all of the cores A, B, C varies depending on the sum total of operating frequencies of all of the cores A, B, C. Therefore, if the variation mode of the operating frequencies of all of the cores A, B, C is the same, the power consumption caused by the operation of all of the cores A, B, C varies in a mode similar to that of the operating frequency of the cores A, B, C, as shown in FIG. 5C. In this case, as explained hereinabove with reference to FIG. 2, it is necessary to design power supply capability satisfying the peak value of power consumption. Furthermore, the variation accommodation capability that makes it possible to accommodate such power variations is required and this results in increased cost.

Figure 6A:
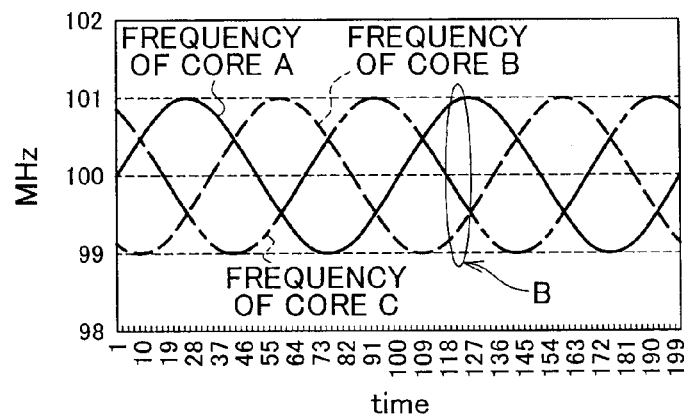
FIGS. 6A to C show waveforms in the case in which the variation mode of the core operating frequency shown in FIG. 4 is applied to all of the three cores according to an embodiment of the invention.
Figure 6B:
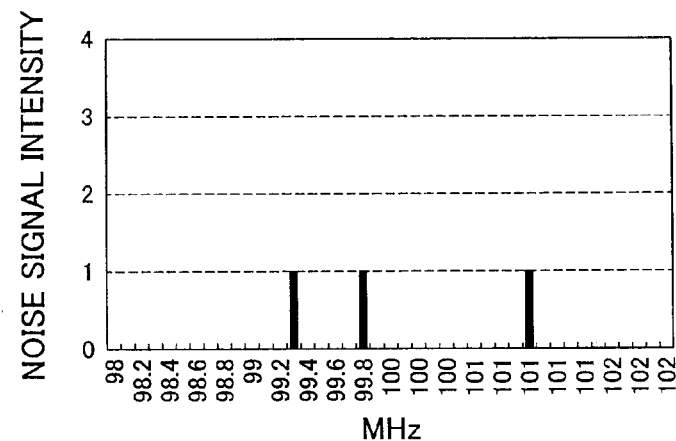
Figure 6C:
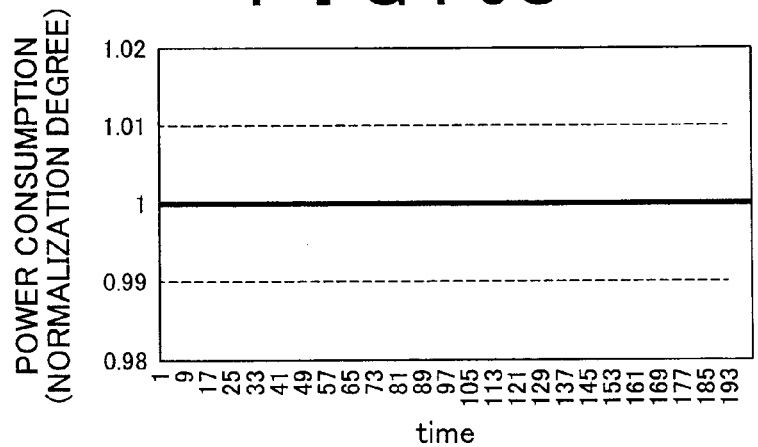

FIGS. 6A to C show waveforms in the case in which the variation mode of the core operating frequency shown in FIG. 4 is applied to the cores A, B, C according to the first embodiment of the invention. FIG. 6A shows a waveform of the variation mode of the operating frequency of the cores A, B, C. FIG. 6B shows a noise frequency generated by the microcomputer at a certain point in time (in the present example, a B portion in FIG. 6A) and the intensity (relative value) of the noise frequency. FIG. 6C shows a time-sequence waveform of power consumption in the time sequence identical to that in FIG. 6A. In FIG. 6C, power consumption is represented by a waveform of normalized power consumption.

As the first embodiment of the invention, the variation mode of the core operating frequency shown in FIG. 4 is applied by providing the cores A, B, C with an equidistant phase shift as shown in FIG. 6A. Thus, the operating frequencies of cores A, B, C vary in the same mode as the variation mode of the operating frequency shown in FIG. 4, but the phases thereof differ from each other. Thus, phases of the variation mode of the operating frequency of the core A, variation mode of the operating frequency of the core B, and variation mode of the operating frequency of the core C are shifted by $2\pi/3$ as shown in FIG. 6A.

In this case, as shown in FIG. 6B noise signals appear at basically separate frequencies in the three cores A, B, C. At a certain point in time, a noise signal appears at the same frequency in two cores from among the three cores A, B, C, but at the same time, in one more core, a noise signal appears at a frequency different from this same frequency. Therefore, by shifting the variation phases of the operating frequencies of the cores A, B, C with respect to each other as shown in FIGS. 6A to C, it is possible to prevent the noise signals at the operating frequencies from superimposing on each other as shown in FIG. 6B (see FIG. 5B). Thus, by shifting the operating frequency of each core A, B, C in addition to performing frequency variation, it is possible to avoid the overlapping of signal intensities generated due to operating frequencies of the cores A, B, C and reduce the noise peak.

A configuration in which the operating frequency is randomly allocated to each of the three cores A, B, C is also possible, but in such a configuration, the operating frequencies can match each other at an unexpected timing, thereby generating a peak.

In the present embodiment, this issue is addressed by varying the operating frequency so that a constant phase shift is normally provided to each of the three cores A, B, C. As a result, the operating frequencies of the three cores A, B, C are prevented from matching each other and creating a peak.

In the preferred embodiment of the invention, as described hereinabove, the power consumption (sum total) caused by the operation of all of the cores A, B, C varies depending on the sum total of operating frequencies of all of the cores A, B, C. When the variation phases of the operating frequencies of the cores A, B, C are equidistantly shifted with respect to each other, the sum total of the operating frequencies of all of the cores A, B, C is constant and does not depend on time. Therefore, in the present embodiment, the power consumption caused by the operation of all of the cores A, B, C is constant and does not depend on time, as shown in FIG. 6C.

Figure 1:
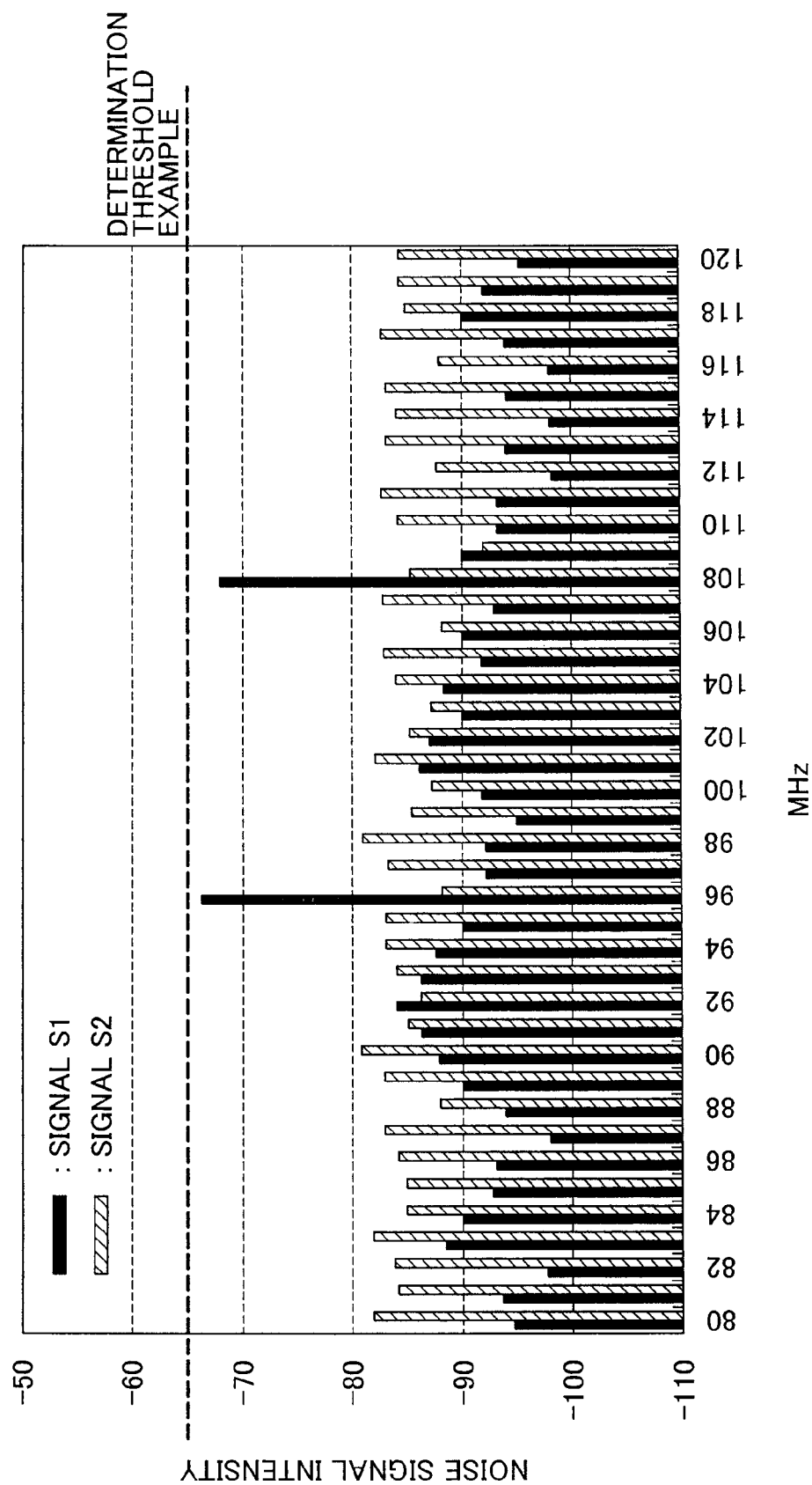
FIG. 1 is a drawing in which a frequency is plotted against the abscissa and a noise signal intensity is plotted against the ordinate for two signals S1, S2.
Figure 2:
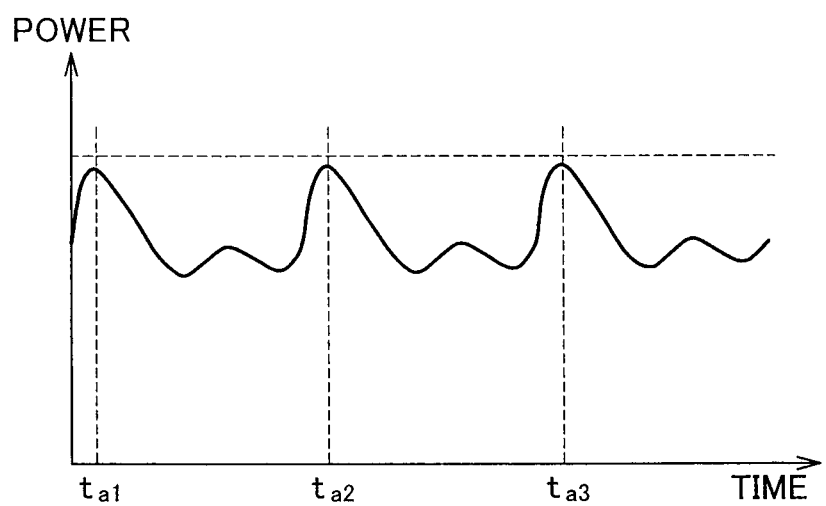
FIG. 2 illustrates an example of how microcomputer power consumption varies with time.

As a result, no peak-like or pulsating variations occur in power consumption and a problem described hereinabove with reference to FIG. 2 can be prevented.

In the present embodiment, as described hereinabove, operating frequencies in the same range but shifted by phase are used in the three cores A, B, C. As a result, the symmetry of capabilities of the cores A, B, C (equivalency of core capabilities) can be maintained. A method of setting the operating frequency of each core to a difference value (for example, 105 MHz for core A, 100 MHz for core B, and 95 MHz for core C) or changing the value as a central frequency can be also considered, but with such a method, a difference will appear between the processing capabilities of the cores A, B, C, and the equivalency of core capabilities, which is a specific feature of the cores A, B, C of the symmetrical multicore and asymmetrical multicore (see FIG. 3), is lost. It means that limitations are placed on the arrangement of applications (which core from among the cores A, B, C is used for processing).

FIG. 7 shows an example of internal and external circuit configurations of a microcomputer (multicore processor) 1 according to the above-described embodiment.

The microcomputer 1 is provided with subsystems 20A, 20B, 20C including the three cores A, B, C, respectively, an oscillation circuit 12, a multiplying circuit 15, and three frequency spreaders 16A, 16B, 16C. An oscillator 14 that is provided outside is connected to the oscillation circuit 12. The oscillator 14 may be also provided inside the microcomputer 1. The output of the oscillation circuit 12 is connected to the multiplying circuit 15, and the output of the multiplying circuit 15 is connected to the three frequency spreaders 16A, 16B, 16C.

The multiplying circuit 15 is constituted, for example, by a phase locked loop (PLL) and multiplies a frequency $f_{org}$ (internal clock frequency) of a clock source signal generated in the oscillation circuit 12. Thus, $f_{PLL}=d \times f_{org}$. Here, $f_{PLL}$ stands for a frequency of the clock signal from the multiplying circuit 15, and d is a constant. In the case of a low frequency, the multiplying circuit 15 may be omitted, but typically in the case of a frequency of equal to or higher than several tens of megahertz (MHz), this circuit is necessary to multiply the frequency generated by the oscillation circuit 12.

The frequency spreaders 16A, 16B, 16C are provided correspondingly to the subsystems 20A, 20B, 20C of the cores A, B, C. The frequency spreaders 16A, 16B, 16C are provided to vary cyclically the frequency. Thus, the frequency spreaders 16A, 16B, 16C vary cyclically the frequency of clock signals from the multiplying circuit 15. In the example shown in the figure, the frequency spreaders 16A, 16B, 16C perform cyclic variations in the following forms.

$$f_A(T)=f_{PLL} \times \{1+e \times \sin(g \times T)\}.$$

$$f_B(T)=f_{PLL} \times \{1+e \times \sin(g \times T+2\pi/3)\}.$$

$$f_C(T)=f_{PLL} \times \{1+e \times \sin(g \times T+4\pi/3)\}.$$

Here, $f_A(T)$ represents a frequency variation form in the frequency spreader 16A, that is, the frequency variation form of the operating frequency of the core A, $f_B(T)$ represents a frequency variation form in the frequency spreader 16B, that is, the frequency variation form of the operating frequency of the core B, and $f_C(T)$ represents a frequency variation form in the frequency spreader 16C, that is, the frequency variation form of the operating frequency of the core C. Further, e, g are constants. In the conversion equations of the above-described frequency spreaders 16A, 16B, 16C, $f_{PLL}$ is taken as a central frequency, and the frequency varies sinusoidally with the same amplitude ($=f_{PLL} \times e$). In this case, the phases of the sinusoids are shifted by $2\pi/3$ between $f_A(T)$, $f_B(T)$, and $f_C(T)$. Thus, in accordance with the above-described embodiment, the frequency spreaders 16A, 16B, 16C perform cyclic variation of operating frequencies of the cores A, B, C in which the variation phases of the operating frequencies of the cores A, B, C are shifted by $2\pi/3$ with respect to each other.

Figure 8:
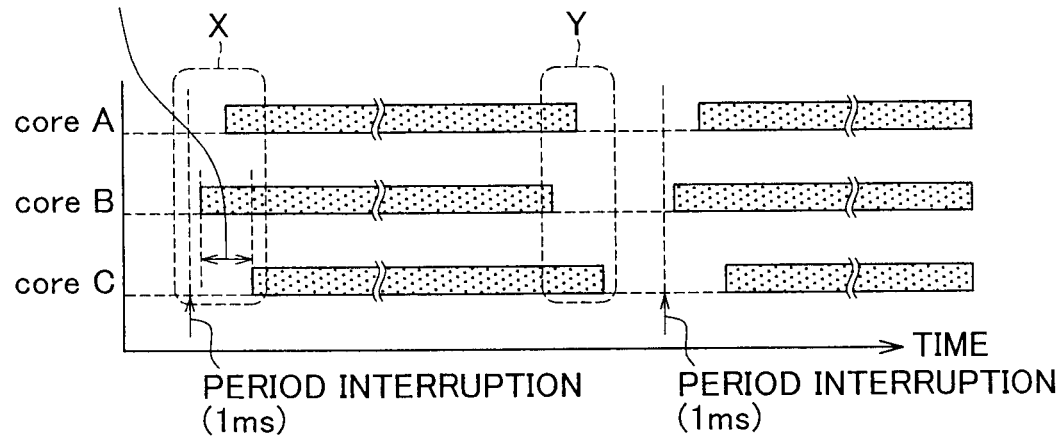
FIG. 8 is a timing chart illustrating an example of processing operation of each core of the microcomputer shown in FIG. 7.

FIG. 8 is a timing chart illustrating an example of processing operation of the cores A, B, C of the microcomputer 1 shown in FIG. 7.

In the example shown in FIG. 8, a case is assumed in which there is one interruption timing serving as a base point of 1 m cyclic processing, and the 1 m cyclic processing that starts thereafter is, for example, such that (operating frequency $f_B$ of the core B)>(operating frequency $f_A$ of the core A)>(operating frequency $f_C$ of the core C) at this instant (to be exact, after the interruption and before the processing is started). In this case, the start timing of the processing that will be started also follows this order. When the frequency varies at 100 MHz±5%, the interval after the interruption and before the processing is started is 50 clocks, and the operating frequencies of the cores A, B, C at this instant are as follows: operating frequency $f_A$=100 MHz, operating frequency $f_B$=102.5 MHz, operating frequency $f_C$=97.5 MHz, and the maximum difference in time to the processing start is 25 ns, although there is a difference between the core B and the core C. Such an extremely small difference causes not problems in terms of processing accuracy. The operating frequencies of the cores A, B, C vary as described hereinabove during the processing. The processing time is generally much longer than the frequency variation period and therefore the processing capabilities of the cores A, B, C are averaged over the processing time and become substantially identical. Therefore, the processing end timing of the cores A, B, C follows the order substantially identical to that of the start timing (see the X portion in FIG. 8) and the difference in the end timing is substantially equal to the difference in the start timing, as shown in the Y portion in FIG. 8. Thus, even if the variation phases of operating frequencies of the cores A, B, C are shifted as described hereinabove, no effect is produced on the processing operation. In other words, a software designer is not required to pay any special attention to the variation phase shift of operating frequencies of the cores A, B, C. In the example shown in FIG. 8, for the sake of convenience of consideration of the above-described effect produced by the variation phase shift of operating frequencies, the processing of all of the cores A, B, C is assumed to be identical (same processing contents of software), but the effect of the variation phase shift of operating frequencies is similarly essentially absent even when the processing contents of the cores A, B, C are different.

Further, in the present embodiment, the cores A, B, C of the microcomputer 1 are basically operated at different frequencies at each point in time, but where the verification of a design stage that may cause concerns is performed at the lowest value and highest value of the variation frequency, in the same manner as in the case in which the frequency of a single core is varied, the configuration in which the cores A, B, C operate at different frequencies can be also verified. This is the advantage of using the configuration in which the cores A, B, C are shifted only in time within the same frequency range.

The following effects can be demonstrated with the microcomputer 1 of the above-described present embodiment.

As described hereinabove, by shifting a frequency variation of each core with time by $2\pi/N$, while causing regular variations within a range with a central frequency $\pm \Delta F$ (in the above-described example, the central frequency is 100 MHz±1 MHz), with respect to N (in the above-described example, N=3) cores from among the multiple cores, it is possible to reduce the noise intensity and also impart the symmetry (equal distribution) of the processing capabilities (dependence on frequency) of the N cores, and ensure equalization of power consumption.

More specifically, by shifting the phase of frequency variation of each core in addition to performing frequency variation, it is possible to avoid the overlapping of signal intensities generated due to the frequencies of the cores and reduce the peak (see FIGS. 5B and 6B). Further, because the phase shift amounts between the cores are the same, the sum total of power consumption, which is proportional to the frequency, assumes a constant value (see FIG. 6C) and the power source IC can be efficiently designed. Since the operating frequencies of the cores A, B, C are set in the same frequency variation modes and only phases thereof are different, the capability symmetry of the cores A, B, C can be maintained. Further, since the configuration in which only frequency variation is performed is modified only by adding a phase shift, without affecting the software design (see FIG. 8), no special verification is required for semiconductor design.

Figure 9:
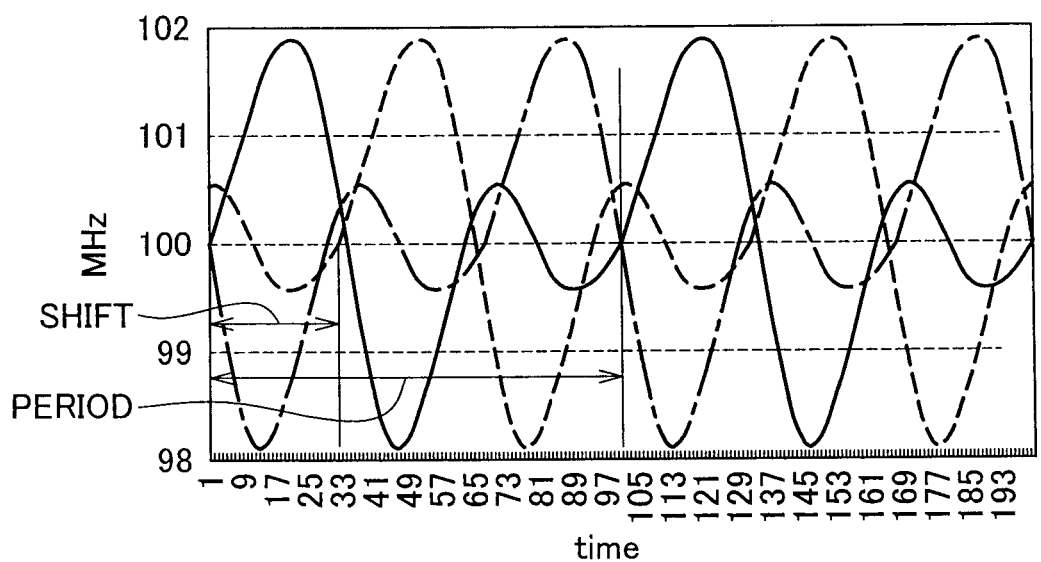
FIG. 9 shows another example of variation mode of operating frequency of each core.

FIG. 9 shows a variation mode of operating frequency of cores A, B, C of the second embodiment of the invention. In the above-described first embodiment, the conversion equations of the above-described frequency spreaders 16A, 16B, 16C are varied sinusoidally (sin(T)) with a constant period, but random frequency variations are also possible. For example, the frequency may be varied in a mode such as shown in FIG. 9. In this case, the same effect as described above can be obtained by a phase shift corresponding to 1/N (N is the number of cores; it is 3 in the example shown in the figure) of the frequency variation period.

Figure 10:
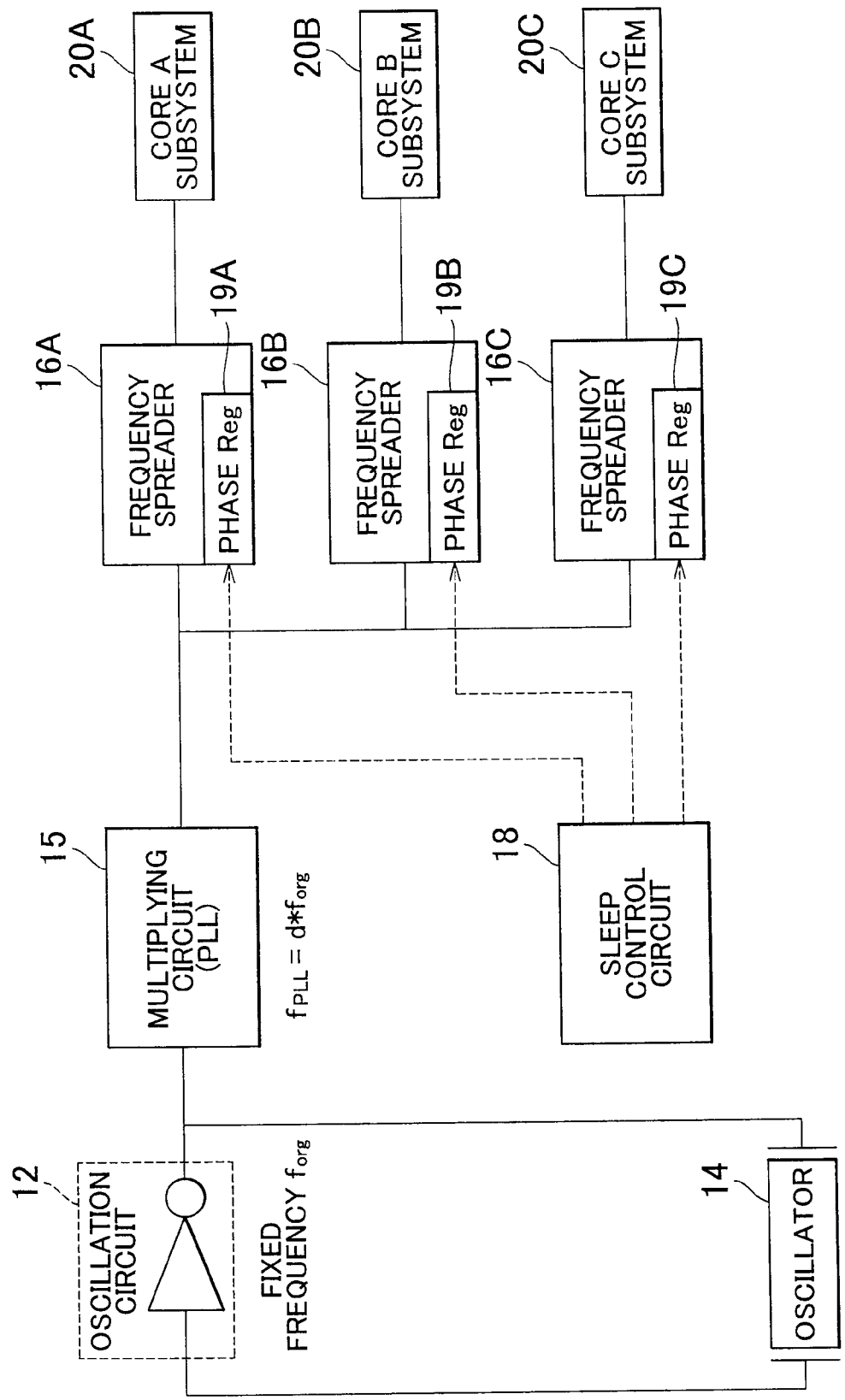
FIG. 10 shows an example of internal and external circuit configurations of a microcomputer according to the second embodiment of the invention.

FIG. 10 shows an example of internal and external circuit configurations of a microcomputer (multicore processor) 2 according to the second embodiment. In the microcomputer of the present embodiment, a configuration is assumed in which a state is present such that the cores A, B, C do not operate constantly. Thus, in addition to the operation state in which all of the cores A, B, C operate, the microcomputer 2 of the present embodiment includes an operation state in which only one of the cores A, B, C operates and other two cores sleep, and/or a state in which only two cores from among the cores A, B, C operate and one remaining core sleeps. For example, the microcomputer 2 can be switched between an asymmetric multiprocessing (AMP) operation and a symmetric multiprocessing (SMP) operation, and a state in which at least one of the cores A, B, C sleeps occurs during the AMP operation. Typically, when a function (task or the like) allocated to a specified core is not executed during the AMP operation, this special core sleeps.

The microcomputer 2 of the present embodiment differs from the microcomputer 1 shown in FIG. 7 mainly in that a sleep control circuit 18 is provided and the frequency spreaders 16A, 16B, 16C are provided with phase registers (phase Reg) 19A, 19B, 19C. Components similar to those of the microcomputer 1 are assigned with like reference numerals and the explanation thereof is herein omitted.

The frequency spreaders 16A, 16B, 16C perform cyclic variations in the following forms:

$$f_A(T)=f_{PLL}\times\{1+e\times\sin(g\times T+\alpha 1)\},$$

$$f_B(T)=f_{PLL}\times\{1+e\times\sin(g\times T+\alpha 2)\},$$

$$f_C(T)=f_{PLL}\times\{1+e\times\sin(g\times T+\alpha 3)\},$$

where $\alpha 1$, $\alpha 2$, $\alpha 3$ are determined by the values of the phase registers 19A, 19B, 19C.

The sleep control circuit 18 determines the operation state (whether operates or sleeps) of each core A, B, C and controls the values $\alpha 1$, $\alpha 2$, $\alpha 3$ of the phase registers 19A, 19B, 19C correspondingly to the determination result. The operation state of the cores A, B, C can be easily determined for example on the basis of information from software.

The values $\alpha 1$, $\alpha 2$, $\alpha 3$ of the phase registers 19A, 19B, 19C have a function of adjusting the phase shift amount of the corresponding frequency spreaders 16A, 16B, 16C. Thus, the phase shift amount of the frequency spreaders 16A, 16B, 16C is determined by the values $\alpha 1$, $\alpha 2$, $\alpha 3$ of the corresponding phase registers 19A, 19B, 19C. The values $\alpha 1$, $\alpha 2$, $\alpha 3$ of the corresponding phase registers 19A, 19B, 19C are controlled (rewritten) by the above-described sleep control circuit 18.

For example, when the cores A, B, C operate, the sleep control circuit 18 writes the phase shift amounts $0, 2\pi/3, 4\pi/3$ to the values $\alpha 1$, $\alpha 2$, $\alpha 3$ of the corresponding phase registers 19A, 19B, 19C. As a result, as shown in FIG. 6A, the operating frequencies of the cores A, B, C (frequencies of clock signals) vary with the variation phases shifted by the $2\pi/3$ phase with respect to each other.

Figure 11:
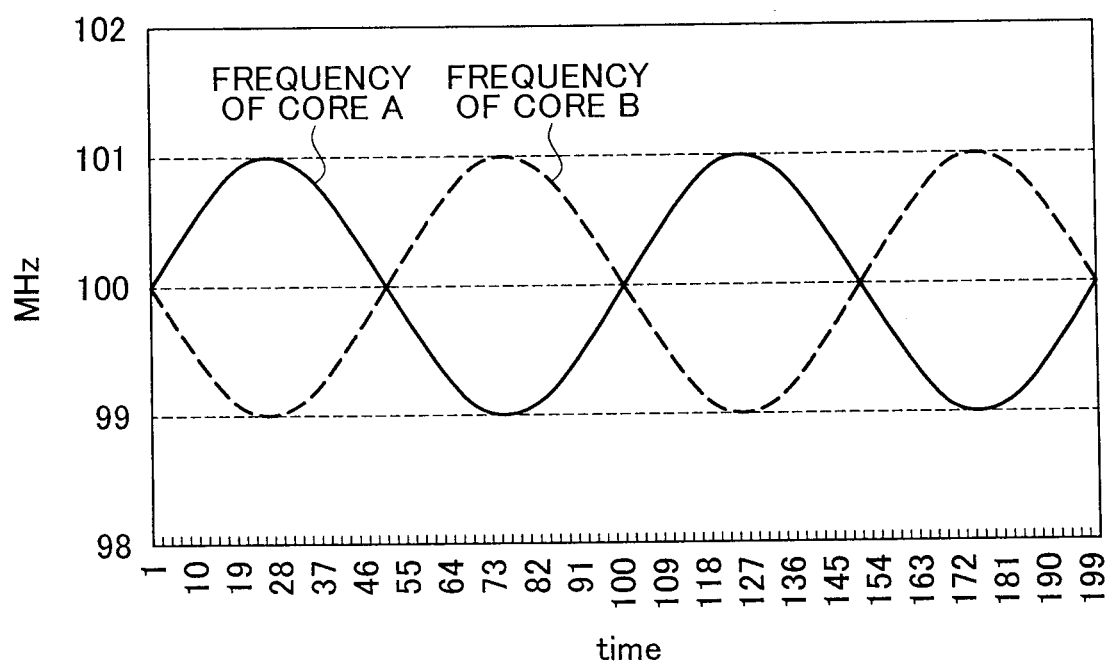
FIG. 11 shows a waveform of variation mode of operating frequency of two other cores when the third core is in a sleeping mode.

Meanwhile, for example, when the cores A, B operate and the core C sleeps, the sleep control circuit 18 writes phase shift amounts $0, \pi$ to the values $\alpha 1$, $\alpha 2$ of the phase registers 19A, 19B. At the same time, the clock signal to the core C is stopped. The clock signal to the core C may be also stopped by clock gating. Alternatively, the clock signal to the core C may be stopped by blocking power supply with power gating. As a result, as shown in FIG. 11, the operating frequencies of the cores A, B (frequencies of clock signals) vary with the variation phases shifted by the $\pi$ phase with respect to each other. Therefore, in this case, the effect similar to that shown in FIG. 6A can be also obtained. Thus, the peak caused by core frequencies can be reduced and constant power consumption can be obtained.

Likewise, for example, when the cores A, C operate and the core B sleeps, the sleep control circuit 18 writes phase shift amounts $0, \pi$ to the values $\alpha 1$, $\alpha 3$ of the phase registers 19A, 19C. At the same time, the clock signal to the core B is stopped. As a result, the operating frequencies of the cores A, C (frequencies of clock signals) vary with the variation phases shifted by the $\pi$ phase with respect to each other. Therefore, in this case, the peak caused by core frequencies can be reduced and constant power consumption can be obtained in the same manner as in the case illustrated by FIG. 6A.

Likewise, for example, when the cores B, C operate and the core A sleeps, the sleep control circuit 18 writes phase shift amounts $2\pi/3, 5\pi/3$ to the values $\alpha 2$, $\alpha 3$ of the phase registers 19B, 19C. At the same time, the clock signal to the core A is stopped. As a result, the operating frequencies of the cores B, C (frequencies of clock signals) vary with the variation phases shifted by the phase with respect to each other. Therefore, in this case, the peak caused by core frequencies can be reduced and constant power consumption can be obtained in the same manner as in the case illustrated by FIG. 6A.

In addition to the effects similar to those demonstrated by the microcomputer 1 of the first embodiment, the above-described microcomputer 2 of the second embodiment demonstrates the following effect.

As mentioned hereinabove, the above-described various effects can be maintained even when the operation state of the cores A, B, C have changed by appropriately varying the shift amount of variation phases of the operating frequencies of the operating cores according to the operation state of the cores A, B, C. Thus, even when the operation states of the cores A, B, C have changed, a state in which the variation phases of the operating frequencies of the operating cores are shifted by the same amount can be maintained and therefore the effects such as prevention of superposition of the frequency-induced noise signals and stabilization of power consumption can be maintained.

The microcomputers 1, 2 of the above-described embodiments may be incorporated in an onboard electronic control unit (ECU) configured to control a vehicle. In this case, the cores A, B, C may cooperatively execute the functions of one system from among various onboard systems (for example, a periphery monitoring system using a periphery monitoring camera, a parking aid system, a navigation system, and the like), or may independently execute the functions of each separate system.

The embodiments of the invention are explained above, but the invention is not limited to the above-described embodiments, and the above-described embodiments can be variously changed or modified without departing from the scope of the invention.

For example, in the above-described embodiments, a phase shift between the cores is set to $2\pi/3$ with respect to the three cores A, B, C, but generally when the number of cores is N, the phase shift amount among the cores can be represented by $2\pi \cdot m/N$. Here, m is a positive integer satisfying the condition $m \neq N \times 1 (1=0, 1, 2, 3 \ldots)$. For example, when N=3, m may be any of $m=1, 2, 4, 5, 7, 8 \ldots$ and therefore the phase shift amount between the cores may be any of $2\pi/3$, $4\pi/3$, $8\pi/3$, $10\pi/3$, $14\pi/3$, $16\pi/3$.

What is claimed is:

1. A multicore processor comprising:
   a plurality of cores, wherein:
   the plurality of cores are configured to each operate at an operation clock, each operation clock having a frequency varying cyclically, wherein periods of the cyclic variations are the same; and
   a variation phase of the frequency of the operation clock of each core of the plurality of cores is shifted by a predetermined amount, wherein the predetermined amount is the same among the plurality of cores.

2. The multicore processor according to claim 1, wherein:
   the number of the plurality of cores is an integer and is equal to or greater than 2; and
   the variation phase of the frequency of the operation clock of each core is shifted by a phase corresponding to a time that is obtained by dividing the period by the number of the plurality of cores.

3. The multicore processor according to claim 1, wherein:
   a central frequency during the variations of a frequency of the operation clock of each core of the plurality of cores is the same among the plurality of cores; and
   an amplitude of the frequency of the operation clock of each core of the plurality of cores is the same among the plurality of cores.

4. The multicore processor according to claim 1, wherein a variation mode of the frequency of the operation clock of each core of the plurality of cores is the same among the plurality of cores.

5. The multicore processor according to claim 1, wherein a shift amount of the variation phase of the frequency of the operation clock among the cores during operation is changed in accordance with an operational condition of the plurality of cores.

6. An onboard electronic control unit comprising:
   a multicore processor having a plurality of cores, wherein the plurality of cores are each configured to operate at an operation clock, each operation clock having a frequency varying cyclically, wherein periods of the cyclic variations are the same, and
   a variation phase of the frequency of the operation clock of each core of the plurality of cores is shifted by a predetermined amount, wherein the predetermined amount is the same among the plurality of cores.

7. The multicore processor according to claim 1, wherein the frequency of the operation clock of each core is set to vary cyclically within a predetermined range around a particular frequency.

8. The multicore processor according to claim 7, wherein the predetermined range is ±1 MHz.

9. The multicore processor according to claim 8, wherein the particular frequency is 100 MHz.

10. The multicore processor according to claim 1, wherein the frequency of the operation clock of each core is set to vary sinusoidally within a predetermined range around a center frequency.

11. The multicore processor according to claim 10, wherein the predetermined range is ±1 MHz.

12. The multicore processor according to claim 11, wherein the center frequency is 100 MHz.

* * * * *